United States Patent
Gaevski et al.

(10) Patent No.: US 10,892,381 B2
(45) Date of Patent: Jan. 12, 2021

(54) SEMICONDUCTOR STRUCTURE WITH LAYER HAVING PROTRUSIONS

(71) Applicant: Sensor Electronic Technology, Inc., Columbia, SC (US)

(72) Inventors: Mikhail Gaevski, West Columbia, TX (US); Alexander Dobrinsky, Silver Spring, MD (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 16/288,852

(22) Filed: Feb. 28, 2019

(65) Prior Publication Data
US 2019/0267512 A1  Aug. 29, 2019

Related U.S. Application Data

(60) Provisional application No. 62/636,835, filed on Feb. 28, 2018.

(51) Int. Cl.
*H01L 33/22* (2010.01)
*H01L 33/00* (2010.01)
*H01L 33/32* (2010.01)

(52) U.S. Cl.
CPC ............ *H01L 33/22* (2013.01); *H01L 33/002* (2013.01); *H01L 33/007* (2013.01); *H01L 33/32* (2013.01)

(58) Field of Classification Search
CPC ....... H01L 33/22; H01L 33/32; H01L 33/007; H01L 33/002; H01L 2933/0091; H01L 21/7806; H01L 33/025
See application file for complete search history.

(56) References Cited

U.S. PATENT DOCUMENTS

| | | | |
|---|---|---|---|
| 8,093,611 B2 * | 1/2012 | Son | H01L 21/02458 257/98 |
| 8,263,989 B2 * | 9/2012 | Cheong | H01L 33/10 257/103 |
| 2011/0198642 A1 * | 8/2011 | Kim | H01L 33/38 257/98 |
| 2014/0014974 A1 * | 1/2014 | Chang | H01L 33/20 257/79 |
| 2014/0138613 A1 * | 5/2014 | Kim | H01L 33/22 257/13 |
| 2014/0191243 A1 * | 7/2014 | Singh | H01L 33/007 257/76 |
| 2015/0091037 A1 * | 4/2015 | Jung | H01L 33/405 257/98 |
| 2015/0207034 A1 * | 7/2015 | Sakong | H01L 33/22 257/13 |
| 2015/0295127 A1 | 10/2015 | Shur et al. | |
| 2015/0295155 A1 | 10/2015 | Shur et al. | |
| 2016/0336483 A1 | 11/2016 | Shatalov et al. | |
| 2016/0343901 A1 | 11/2016 | Shur et al. | |

(Continued)

Primary Examiner — Syed I Gheyas
(74) Attorney, Agent, or Firm — LaBatt, LLC

(57) ABSTRACT

A growth layer having a growth surface with protruding domains is described. The protruding domains can be separated by a substantially flat growth surface located between the protruding domains. A protruding domain can include an internal region that can be filled with a gas and/or can be partially or completely filled with one or more materials that differ from the material of the growth layer, which forms an outer surface of each of the protruding domains.

20 Claims, 10 Drawing Sheets

(56) References Cited

U.S. PATENT DOCUMENTS

| | | |
|---|---|---|
| 2017/0110628 A1 | 4/2017 | Shatalov et al. |
| 2017/0186905 A1 | 6/2017 | Shur et al. |
| 2017/0207367 A1 | 7/2017 | Dobrinsky et al. |
| 2017/0229612 A1 | 8/2017 | Shatalov et al. |
| 2017/0352776 A1 | 12/2017 | Shur et al. |
| 2017/0373224 A1 | 12/2017 | Shatalov et al. |
| 2018/0108806 A1 | 4/2018 | Jain et al. |
| 2018/0188315 A1 | 7/2018 | Dobrinsky et al. |
| 2018/0269355 A1 | 9/2018 | Jain et al. |
| 2018/0315886 A1 | 11/2018 | Gaevski et al. |
| 2018/0323071 A1 | 11/2018 | Shatalov et al. |
| 2018/0323345 A1 | 11/2018 | Dobrinsky et al. |
| 2019/0019917 A1 | 1/2019 | Jain et al. |

\* cited by examiner

FIG. 3
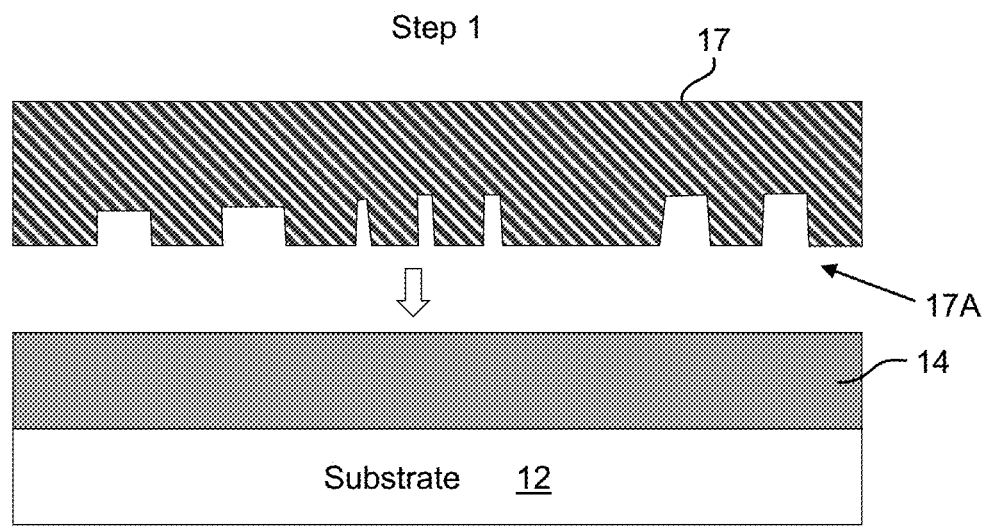
Step 1
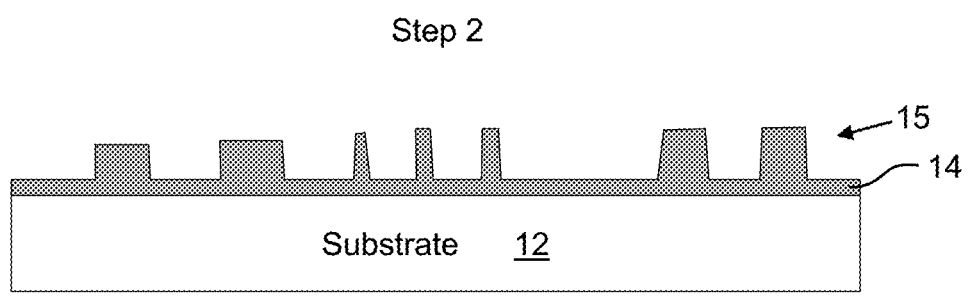
Step 2
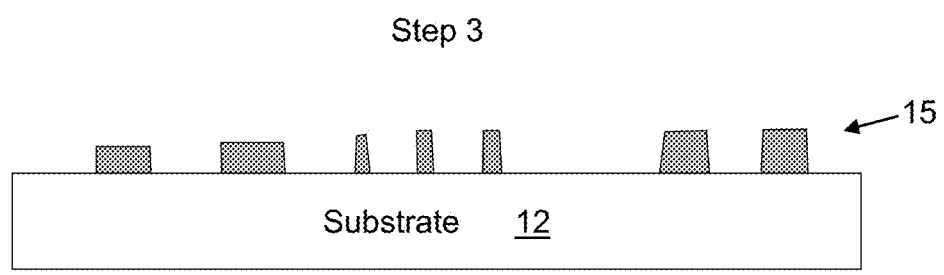
Step 3

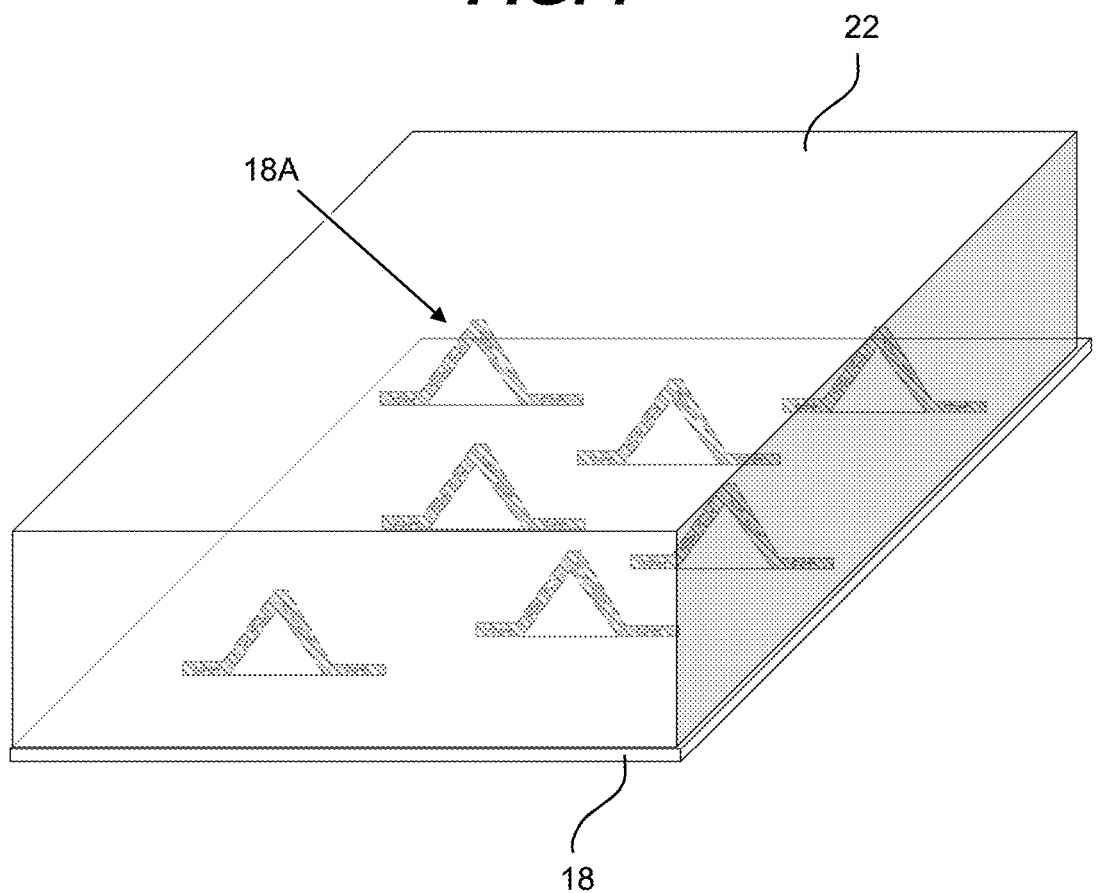

SEMICONDUCTOR STRUCTURE WITH LAYER HAVING PROTRUSIONS

REFERENCE TO RELATED APPLICATIONS

The current application claims the benefit of U.S. Provisional Application No. 62/636,835, filed on 28 Feb. 2018, which is hereby incorporated by reference.

TECHNICAL FIELD

The disclosure relates generally to semiconductor structures, and more particularly, to a semiconductor structure including one or more layers with protrusions.

BACKGROUND ART

Semiconductor structures are fabricated as part of the manufacture of various types of semiconductor devices, including optoelectronic devices. Optoelectronic devices include semiconductor emitting devices, such as light emitting diodes (LEDs) and laser diodes (LDs), which can be solid state emitting devices composed of group III-V semiconductors. A subset of group III-V semiconductors includes group III nitride alloys, which can include binary, ternary and quaternary alloys of indium (In), aluminum (Al), gallium (Ga), and nitrogen (N). Illustrative group III nitride based LEDs and LDs can be of the form $In_yAl_xGa_{1-x-y}N$, where x and y indicate the molar fraction of a given element, $0 \leq x$, $y \leq 1$, and $0 \leq x+y \leq 1$. Other illustrative group III nitride based LEDs and LDs are based on boron (B) nitride (BN) and can be of the form $Ga_zIn_yAl_xB_{1-x-y-z}N$, where $0 \leq x$, y, $z \leq 1$, and $0 \leq x+y+z \leq 1$.

The semiconductor structure of an LED is typically composed of multiple semiconductor layers. During operation of the LED, an applied bias across doped semiconductor layers leads to the injection of electrons and holes into an active region where electron-hole recombination leads to light generation. Light is generated with uniform angular distribution and escapes the LED die by traversing the semiconductor layers in all directions. Each semiconductor layer has a particular combination of molar fractions (e.g., x, y, and z) for the various elements, which influences the optical properties of the layer. In particular, the refractive index and absorption characteristics of a semiconductor layer are sensitive to the molar fractions of the semiconductor alloys present in the layer.

An interface between two semiconductor layers is defined as a semiconductor heterojunction. At an interface, the combination of molar fractions is assumed to change by a discrete amount. A layer in which the combination of molar fractions changes continuously is said to be graded. Changes in molar fractions of semiconductor alloys can allow for band gap control, but can lead to abrupt changes in the optical properties of the materials and result in light trapping. A larger change in the index of refraction between the semiconductor layers, and between the substrate and its surroundings, results in a smaller total internal reflection (TIR) angle (provided that light travels from a high refractive index material to a material with a lower refractive index). A small TIR angle results in a large fraction of light rays reflecting from the interface boundaries, thereby leading to light trapping and subsequent absorption by the semiconductor layers and/or LED metal contacts.

Roughness at an interface allows for partial alleviation of the light trapping by providing additional surfaces through which light can escape without totally internally reflecting from the interface. Nevertheless, light only can be partially transmitted through the interface, even if it does not undergo TIR, due to Fresnel losses. Fresnel losses are associated with light partially reflected at the interface for all the incident light angles. Optical properties of the materials on each side of the interface determine the magnitude of Fresnel losses, which can be a significant fraction of the light generated by the active region. Roughness at an interface also allows for partial alleviation of the buildup of stress fields in the semiconductor layers.

SUMMARY OF THE INVENTION

Aspects of the invention provide a growth layer having a growth surface with protruding domains. The growth layer can improve one or more attributes of the semiconductor layer(s) grown thereon and/or one or more attributes of an optoelectronic device fabricated from the semiconductor heterostructure. The protruding domains can be separated by a substantially flat growth surface located between the protruding domains. A protruding domain can include an internal region that can be filled with a gas and/or can be partially or completely filled with one or more materials that differ from the material of the growth layer, which forms an outer surface of each of the protruding domains.

A first aspect of the invention provides a heterostructure for an optoelectronic device, the heterostructure comprising: an active region configured to operate in conjunction with radiation having an operating wavelength; a substrate having a growth surface; and a growth layer located between the active region and the growth surface of the substrate, wherein the growth layer is formed of a first material and includes a plurality of protruding domains extending away from the growth surface of the substrate toward the active region, and wherein at least some of the plurality of protruding domains include internal regions comprising a second material different from the first material, wherein an index of refraction of the second material for radiation having the operating wavelength is lower than an index of refraction of the first material for radiation having the operating wavelength.

A second aspect of the invention provides an optoelectronic device comprising: an active region configured to operate in conjunction with radiation having an operating wavelength; a first semiconductor layer located on a first side of the active region; and a growth layer, wherein the first semiconductor layer is located between the growth layer and the active region, wherein the growth layer is formed of a first material and includes a plurality of protruding domains extending toward the active region, and wherein at least some of the plurality of protruding domains include internal regions comprising a second material different from the first material, wherein an index of refraction of the second material for radiation having the operating wavelength is lower than an index of refraction of the first material for radiation having the operating wavelength.

A third aspect of the invention provides a method of fabricating a heterostructure for an optoelectronic device, the method comprising: forming a growth layer adjacent to a growth surface of a substrate; and forming an active region configured to operate in conjunction with radiation having an operating wavelength, wherein the growth layer is formed of a first material and includes a plurality of protruding domains extending away from the growth surface of the substrate toward the active region, and wherein at least some of the plurality of protruding domains include internal regions comprising a second material different from the first material, wherein an index of refraction of the second material for radiation having the operating wavelength is lower than an index of refraction of the first material for radiation having the operating wavelength.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 3 shows another illustrative process for fabricating a pattern layer for a heterostructure for an optoelectronic device according to an embodiment.

FIG. 7 shows an illustrative semiconductor layer fabricated on a growth layer according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a growth layer having a growth surface with protruding domains. The growth layer can improve one or more attributes of the semiconductor layer(s) grown thereon and/or one or more attributes of an optoelectronic device fabricated from the semiconductor heterostructure. The protruding domains can be separated by a substantially flat growth surface located between the protruding domains. A protruding domain can include an internal region that can be filled with a gas and/or can be partially or completely filled with one or more materials that differ from the material of the growth layer, which forms an outer surface of each of the protruding domains.

It is understood that, unless otherwise specified, each value is approximate and each range of values included herein is inclusive of the end values defining the range. As used herein, unless otherwise noted, the term "approximately" is inclusive of values within +/− ten percent of the stated value, while the term "substantially" is inclusive of values within +/− five percent of the stated value. Unless otherwise stated, two values are "similar" when the smaller value is within +/− twenty-five percent of the larger value. A value, y, is on the order of a stated value, x, when the value y satisfies the formula $0.1x \leq y \leq 10x$. As used herein, a "characteristic size" of an object corresponds to a measurement of the physical size of the object that defines its influence on a system. In a more particular embodiment, a characteristic two-dimensional measurement can be calculated at the largest cross section. A characteristic one-dimensional measurement can be calculated as the square root of the corresponding characteristic two-dimensional measurement.

As also used herein, a layer is transparent when the layer allows at least ten percent of radiation having an operating wavelength, which is radiated at a normal incidence to an interface of the layer, to pass there through. Furthermore, as used herein, a layer is a reflective layer when the layer reflects at least ten percent of radiation having an operating wavelength, which is radiated at a normal incidence to an interface of the layer. In an embodiment, the operating wavelength of the radiation corresponds to a wavelength of radiation emitted or sensed (e.g., peak wavelength+/− five nanometers) by an active region of an optoelectronic device during operation of the device. For a given layer, the wavelength can be measured in a material of consideration and can depend on a refractive index of the material. Additionally, as used herein, a contact is considered "ohmic" when the contact exhibits close to linear current-voltage behavior over a relevant range of currents/voltages to enable use of a linear dependence to approximate the current-voltage relation through the contact region within the relevant range of currents/voltages to a desired accuracy (e.g., +/− one percent).

Figure 1:
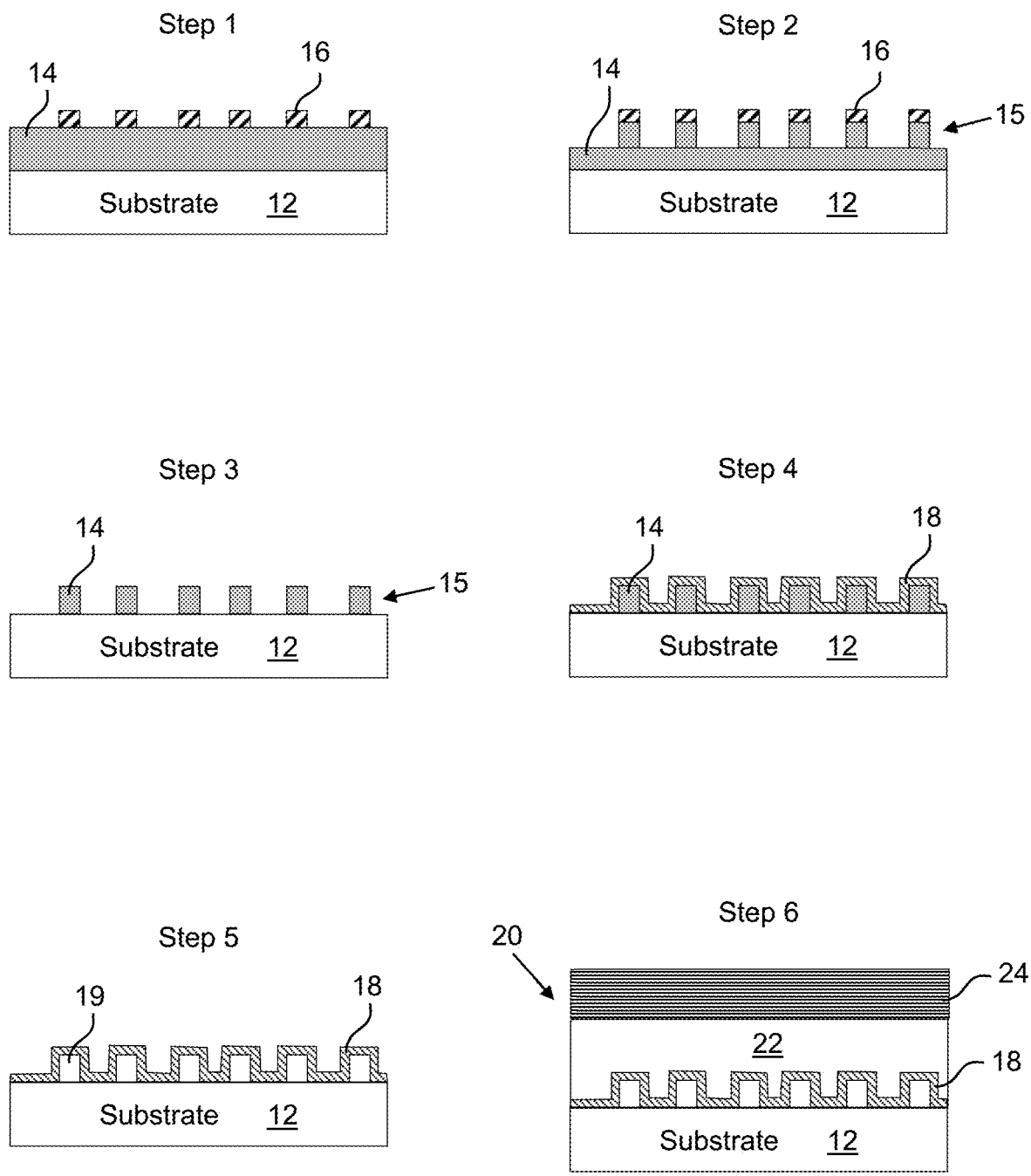
FIG. 1 shows an illustrative process for fabricating a heterostructure for an optoelectronic device according to an embodiment.

Turning to the drawings, FIG. 1 shows an illustrative process for fabricating a heterostructure for an optoelectronic device according to an embodiment. As illustrated in step 1, a pattern layer 14 is deposited on a substrate 12 using any solution. The pattern layer 14 can comprise any suitable material that degrades under heating (e.g., during annealing). For example, illustrative materials include but are not limited to: a polymer, an organic compound (e.g., a photoresist, poly-methyl methacrylate, other synthetic resins, etc.), and/or the like. The pattern layer 14 can be deposited using any solution.

As also illustrated in step 1, a patterned mask layer 16 can be applied to the surface of the pattern layer 14. The mask layer 16 can comprise any suitable material for blocking light from reaching the underlying region of the pattern layer 14, such as quartz or glass covered with a pattern defined with a chrome metal-absorbing film. In step 2, the exposed regions of the pattern layer 14 can be exposed to light during photolithography, thereby creating an imprint pattern 15 on the surface of the pattern layer 14. The imprint pattern 15 can form a period and distribution of the pattern layer 14 surface that includes higher and lower domains.

In step 3, the pattern layer 14 and mask layer 16 can be etched using any solution. For example, oxygen ($O_2$) plasma etching can be used to remove the mask layer 16 and portions of the pattern layer 14. The etching can result in protruding regions of the pattern layer 14 corresponding to the imprint pattern 15. Exposed regions of the surface of the substrate 12 can be present between the regions of the pattern layer 14. In an embodiment, the regions of pattern layer 14 are disjoint, isolated islands of the material of the pattern layer 14, separated by exposed regions of the substrate 12. The surface of the substrate can be substantially flat.

In step 4, a growth layer 18 can be deposited on the surface of the substrate 12 and the pattern layer 14. The growth layer 18 can be deposited using any solution, such as atomic layer deposition. The growth layer 18 can comprise any suitable material which can be used for subsequent growth of semiconductor layer(s) thereon. For example, the growth layer 18 can comprise aluminum oxide ($Al_2O_3$), AlN, and/or the like. In an embodiment, the growth layer 18 has a relatively uniform thickness that is in a range between 10 nanometers and 200 nanometers.

In step 5, the structure can undergo high temperature (e.g., 400 Celsius or higher) annealing in an oxygen atmosphere, which can result in degradation and removal of the pattern layer 14 and formation of cavities within an internal region 19 of the growth layer 18. After completion of step 5, the growth layer 18 can comprise a plurality of protruding domains separated by a substantially flat growth surface.

In step 6, the semiconductor heterostructure 20 can be deposited on the growth layer 18 using any solution. For example, one or more semiconductor layers 22, 24 of the semiconductor heterostructure 20 can be epitaxially grown using metalorganic chemical vapor deposition (MOCVD), sputtering and annealing, and/or the like. In an embodiment, a first semiconductor layer 22 of the semiconductor heterostructure 20 can comprise an aluminum nitride layer that can be deposited directly on the growth layer 18 using, for example, sputtering. Subsequently, the first semiconductor layer 22 can be annealed to result in crystalized domains. In an embodiment, the first semiconductor layer 22 and/or another layer of the semiconductor heterostructure 20 can be grown using a plurality of distinct growth modes. For example, the first semiconductor layer 22 (e.g., an aluminum nitride layer) can be initially grown using a three dimensional growth technique that promotes the growth of vertical isolated structures, such as nano-pillars. Subsequently, during additional growth, the isolated structures can merge to form a coherent layer.

Figure 2:
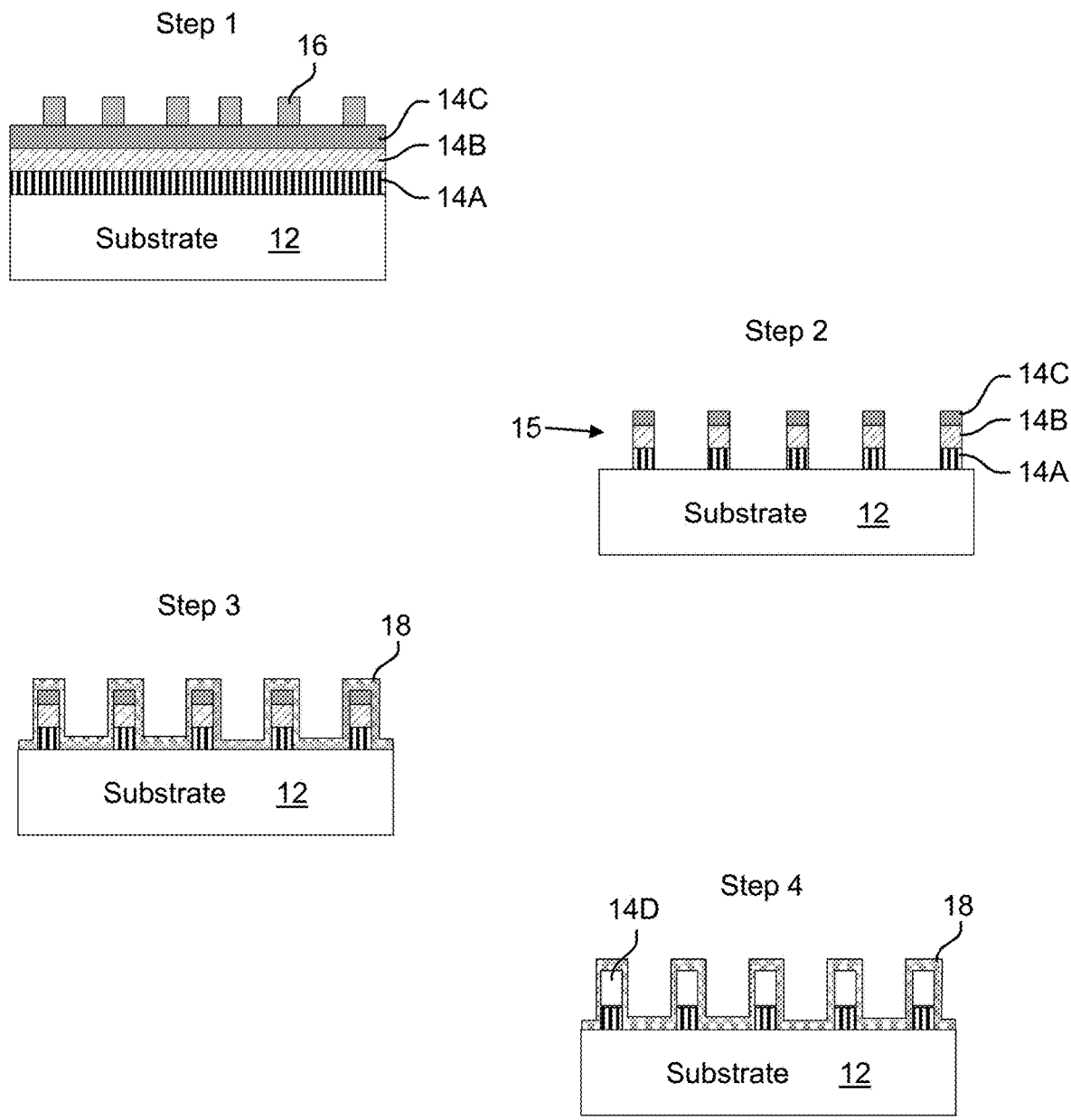
FIG. 2 shows another illustrative process for fabricating a growth layer for a heterostructure for an optoelectronic device according to an embodiment.

While the pattern layer 14 is shown as being formed from a single layer of material, it is understood that this is only illustrative. For example, a pattern layer 14 can be fabricated using multiple sub-layers of distinct materials. The distinct materials can completely or partially fill an internal region of a protruding domain of a growth layer. To this extent, FIG. 2 shows another illustrative process for fabricating a growth layer for a heterostructure for an optoelectronic device according to an embodiment.

As illustrated in step 1, multiple sub-layers 14A-14C of a pattern layer can be deposited on a substrate 12 using any solution. The sub-layers 14A-14C can include, for example, multiple organic, and possibly inorganic layers. In an embodiment, at least one of the sub-layers 14A-14C comprises silicon dioxide. Other illustrative materials for one or more of the sub-layers 14A-14C include aluminum oxide, calcium fluoride, magnesium fluoride, sapphire, aluminum nitride, silicon nitride, AlZnO, and/or the like. While three sub-layers 14A-14C are shown, it is understood that a pattern layer can include any number of two or more sub-layers. In an embodiment, the materials and thicknesses of the sub-layers 14A-14C can be configured to affect electromagnetic radiation. For example, in an embodiment, the sub-layers 14A-14C can have materials and thicknesses that result in the sub-layers 14A-14C forming a distributed Bragg reflector. Furthermore, in an embodiment, one or more of the sub-layers 14A-14C can comprise distinct domains of material, such as spheres.

After the sub-layers 14A-14C of the pattern layer have been deposited, a patterned mask layer 16 can be deposited on the top sub-layer 14C using any solution. The patterned mask layer 16 can include any suitable masking material that is deposited in regions in which it is desired for the sub-layers 14A-14C to remain after etching. In an embodiment, the patterned mask layer 16 comprises a material and a thickness that results in at least a portion of each of the sub-layers 14A-14C remaining after an etching process. In an embodiment, the material of one or more of the sub-layers 14A-14C does not degrade during annealing. Illustrative materials include silicon dioxide, aluminum oxide, calcium fluoride, magnesium fluoride, sapphire, aluminum nitride, silicon nitride, AlZnO, and/or the like.

In step 2, the structure is etched, e.g., using a dry etching process, to result in the sub-layers 14A-14C remaining in a desired pattern 15 with regions of the substrate 12 surface exposed there between. In an embodiment, the pattern 15 results in isolated protruding domains (e.g., pillars) formed of the sub-layers 14A-14C. The pillars can have a high aspect ratio (i.e., >1). In an embodiment, the sub-layers 14A-14C of the pillars can form a pillar of a graded material and/or having a graded index of refraction.

In step 3, a growth layer 18 can be deposited on the surface of the substrate 12 and the sub-layers 14A-14C of the pattern layer. The growth layer 18 can be deposited using any solution, such as atomic layer deposition. The growth layer 18 can comprise any suitable material which can be used for subsequent growth of semiconductor layer(s) thereon, such as aluminum oxide.

In step 4, the structure can be annealed. The annealing can result in some of the materials becoming crystalized. For example, as illustrated, the sub-layers 14B, 14C can crystalize to form a sub-layer 14D to form a layered structure including sub-layers 14A, 14D. Additionally, the growth layer 18 can crystalize or partially crystalize as a result of the annealing.

FIG. 3 shows another illustrative process for fabricating a pattern layer for a heterostructure for an optoelectronic device according to an embodiment. In this case, in a first step, a pattern layer 14 is deposited on a substrate 12 using any solution. The pattern layer 14 can be formed of any suitable material, such as a photoresist. As also shown in step 1, an imprinting template 17 (e.g., a nanoimprint template) can include a pattern 17A (e.g., a nano-pattern) that is the complement of a desired pattern 15 for the pattern layer 14. The pattern 17A can be the complement of any of a variety of possible patterns including but not limited to, for example, a prolonged line pattern, a circular pattern (e.g., for use in engineering of Fresnel lenses), a periodic pattern comprising small protruding structures, an aperiodic pattern, and/or the like. Use of the imprinting template 17 can result in the fabrication of a more precise pattern 15, which may be required in certain applications.

As illustrated, the imprinting template 17 can be pressed onto the pattern layer 14 to form a pattern 15 on the pattern layer 14 as shown in step 2. In addition to pressing the imprinting template 17, it is understood that the process can include heating the imprinting template 17 (e.g., a contact surface thereof) and/or the pattern layer 14, which can assist in forming the pattern 15 on the pattern layer 14. As the contact surface of the imprinting template 17 has a pattern 17A that is the complement of the pattern 15, the pattern layer 14 will have the pattern 15 formed on its surface as a result of the imprinting template 17.

In step 3, the pattern layer 14 can be etched using any solution, which can form protruding regions of the pattern layer 14 corresponding to the imprint pattern 15. Exposed regions of the surface of the substrate 12 can be present between the regions of the pattern layer 14. In an embodiment, the regions of pattern layer 14 are disjoint islands of the material of the pattern layer 14, separated by exposed regions of the substrate 12. These islands can be elongate islands, having any geometry, such as linear, angular (e.g., a circle or portion thereof), and/or the like. Alternatively, the islands can have a length and width that are similar.

While each of the illustrated embodiments includes etching the pattern layer 14 to create exposed regions of the surface of the substrate 12, it is understood that exposed regions can be formed without etching. Additionally, it is understood that the pattern layer 14 can remain continuous in embodiments and may not be completely removed between the protruding regions. To this extent, embodiments of the processes described herein can be performed without etching.

Figure 4:
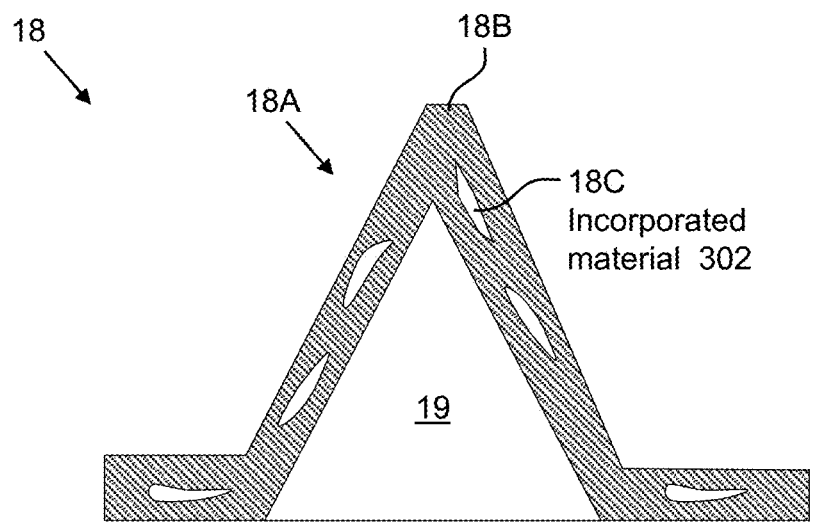
FIG. 4 shows a region of an illustrative growth layer according to an embodiment.

Regardless, a growth layer can be subsequently deposited on the pattern layer 14 as described herein. FIG. 4 shows a region of an illustrative growth layer 18 according to an embodiment. As discussed herein, the growth layer 18 includes protruding domains, such as the protruding domain 18A, which can be formed using any solution, such as one or more of the approaches described herein. To this extent, the protruding domain 18A is shown including an internal region 19, which can comprise a cavity of a gas formed as described herein. Alternatively, the internal region 19 of the protruding domain 18A can include one or more layers formed from one or more sub-layers forming a pattern layer described herein. Additionally, an internal region 19 of the protruding domain 18A can include one or more cavities of a gas as well as layer(s) of material.

In an embodiment, the internal region 19 of the protruding domain 18A has an index of refraction for radiation having an operating wavelength that is lower than an index of refraction of the growth layer 18 for radiation having the operating wavelength. To this extent, a gas and/or other material located within the internal region 19 can have an index of refraction that is lower than the material forming the growth layer 18. In an embodiment, the growth layer 18 and/or the internal region 19 comprises one or more materials transparent to ultraviolet radiation. In an illustrative embodiment, the growth layer comprises aluminum oxide ($Al_2O_3$). In a more particular illustrative embodiment, the growth layer 18 is a partially crystalized aluminum oxide layer, which can be achieved, for example, through annealing. In an embodiment, the internal region 19 can include a material that is configured to scatter the radiation having an operating wavelength. In an embodiment, the internal region 19 includes one or more materials selected from a group including: silicon dioxide, calcium fluoride, magnesium fluoride, sapphire, aluminum nitride, AlZnO, and/or the like.

In an embodiment, a growth layer described herein is formed of a composite material. The growth layer 18 can include a base material 18B that incorporates domains 18C of another material. In an embodiment, the base material 18B comprises aluminum oxide. The domains 18C can comprise, for example, a metal such as platinum, silicon dioxide, and/or the like. During formation of the growth layer 18, the material for the domains 18C can be deposited on the surfaces of the pattern layer and substrate using any solution. For example, the domains 18C can comprise nano-domains 18C (e.g., having a largest dimension less than 1 micron), which can be deposited through evaporation or the like. Subsequently, a thin layer of aluminum can be deposited on the surfaces of the pattern layer, substrate, and the domains 18C using any solution. The growth layer 18 can be formed by annealing and oxidizing the materials. When the growth layer 18 comprises a composite material, the index of refraction for the growth layer 18 can be determined as a weighted average of the materials 18B, 18C that form the composite material. Regardless, the index of refraction of the growth layer 18 can be optimized to allow the maximum light extraction from the structure.

As illustrated by the protruding domain 18A, the protruding domains described herein may have vertical cross-sections that are not rectangular. For example, the protruding domain 18A is illustrated as having a triangular or a trapezoidal vertical cross-section. To this extent, the corresponding protruding regions of the pattern layer 14 (FIG. 1) on which the growth layer 18 is formed can have any of various vertical cross-sectional shapes and three-dimensional shapes.

Figure 5:
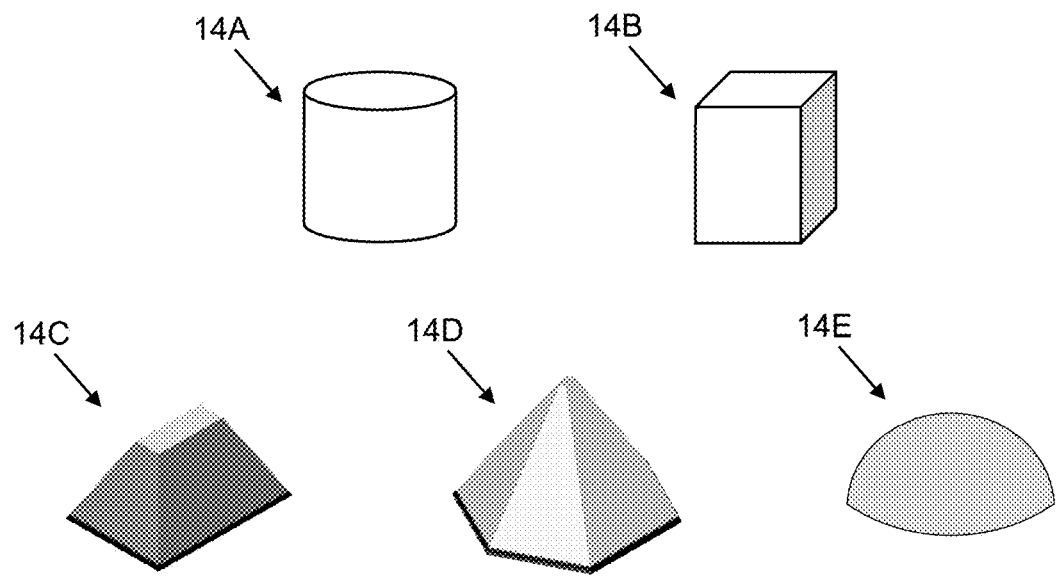
FIG. 5 shows several illustrative protruding regions of a pattern layer with different illustrative shapes according to embodiments.

For example, FIG. 5 shows several illustrative protruding regions 14A-14E of a pattern layer with different illustrative shapes according to embodiments. As illustrated, the possible shapes include a cylindrical column 14A, a polygonal column 14B, and/or the like, each of which includes a generally rectangular vertical cross-section. Other possible shapes include a frustum 14C (polygonal or conical), a pyramid 14D (polygonal or a cone), and/or the like, each of which includes a triangular or trapezoidal vertical cross-section. Furthermore, a protruding region 14E can have a hemispherical shape with a semielliptical vertical cross-section. In general, protruding regions 14A-14E of a pattern layer can have relatively smooth shapes due to annealing and/or surface energy effects.

Figure 6A:
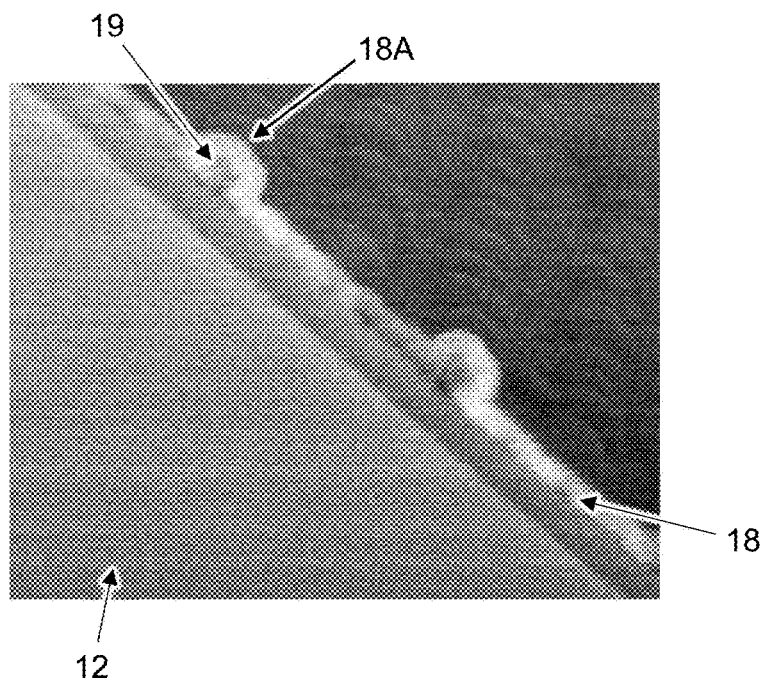
FIGS. 6A and 6B show images of illustrative growth layers fabricated on a substrate according to embodiments.
Figure 6B:
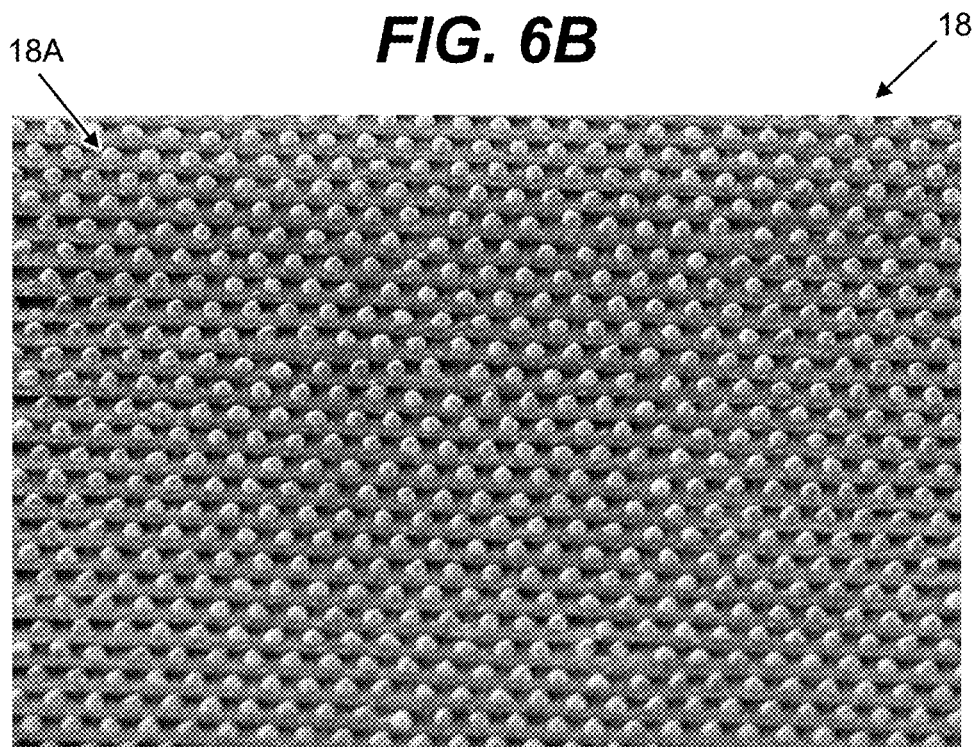

FIGS. 6A and 6B show images of illustrative growth layers 18 fabricated on a substrate 12 (FIG. 6A) according to embodiments. As illustrated in FIG. 6A, the growth layer 18 (e.g., aluminum oxide) includes a plurality of protruding domains 18A. Each protruding domain 18A can include an internal region 19 including a material different than the material of the growth layer 18. For example, the internal region 19 can include silicon dioxide. As illustrated most clearly in FIG. 6B, a growth layer 18 can include protruding domains 18A that are relatively small in size in both length and width and are arranged in a periodic pattern, e.g., a two-dimensional lattice pattern.

In an embodiment, the protruding domains 18A have a size and/or arrangement that forms a photonic crystal. As used herein, a photonic crystal comprises a periodic structure that prevents electromagnetic radiation from propagating in certain directions with certain wavelengths. Formation of a photonic crystal can enhance light extraction efficiency.

In each of the embodiments described herein, the protruding domains of the growth layer can be fabricated to have approximately the same dimensions. In an embodiment, the protruding domains have an average horizontal characteristic size and an average vertical characteristic size that is on the order of one to ten wavelengths (e.g., one to three wavelengths in a more particular embodiment) of the operating wavelength. In an even more particular embodiment, the average characteristic sizes are within a range of one to ten wavelengths of the operating wavelength. As used herein, measurement of the horizontal/lateral characteristic size of a protruding domain is calculated by taking a square root of the lateral cross-sectional area of the structure at its widest cross-section. Measurement of the vertical characteristic size can be calculated by measuring a total height of the protruding domain above the surrounding flat surface.

In an embodiment, the protruding domains of the growth layer can be separated from each other by an average separation distance on the order of one to ten wavelengths of the operating wavelength. In an even more particular embodiment, the average separation distance is within a range of one to ten wavelengths of the operating wavelength. In an embodiment, the average separation distance between the protruding domains exceeds the average horizontal characteristic size of the protruding domains. As used herein, the separation distance is calculated by the shortest distance between the edges of two adjacent protruding domains.

In another more particular embodiment, the average characteristic sizes and the average separation are within a range of one tenth to one wavelength of the operating wavelength. In this case, the growth layer can have an average index of refraction that is between the index of refraction of the underlying layer, such as the substrate, and the index of refraction of the semiconductor layer grown on the growth layer. Furthermore, the growth layer can have a graded effective index of refraction in a direction normal to the substrate surface. The effective index of refraction can be calculated using a weighted average of the indexes of refraction for the various materials along the height of the growth layer. The grading can result in the effective index of refraction being graded from a value that is similar or lower than the index of refraction of the underlying substrate in a location adjacent to the substrate to a value that is approximately the same as the index of refraction of the semiconductor layer in a location at the top of the growth layer.

In another embodiment, the protruding domains of the growth layer can include multiple subsets of protruding domains, with each subset having a different average horizontal characteristic size and/or average vertical characteristic size than those of the other subsets. For example, a growth layer described herein can include a first subset of large protruding domains having an average horizontal characteristic size and/or average vertical characteristic size that is larger than the operating wavelength, and a second subset of small protruding domains having an average horizontal characteristic size and/or average vertical characteristic size that is smaller than the operating wavelength. The respective subsets can be arranged in any manner. For example, the subsets can be interlaced with each other. As illustrated in FIG. 3, subsets of protruding domains of the different sizes can be located in different regions along the plane of the growth layer.

In an embodiment, the shape, size, and/or position of the protruding domains can be used to manipulate the electromagnetic radiation having an operating wavelength at the interface boundary. Such manipulation can be configured to, for example, optimize extraction of the electromagnetic radiation from the interface. For example, the protruding domains can comprise nanopillars having a variable index of refraction due to the different outer and internal regions. In an embodiment, the index of refraction of the outer region can approximately match the index of refraction of the semiconductor layer grown directly thereon at the corresponding interface, while the index of refraction for the internal region can approximately match or be lower than the index of refraction for the substrate. In an embodiment, the particular shapes of the protruding domains are chosen to result in graded index of refraction. In an additional embodiment, large protruding domains can be incorporated with small protruding domains.

As described herein, the growth layer 18 can be used as a top surface of the substrate/structure template for subsequent growth of the semiconductor layers of a semiconductor heterostructure. To this extent, FIG. 7 shows an illustrative semiconductor layer 22 fabricated on a growth layer 18 according to an embodiment. As illustrated, the growth layer 18 includes protruding domains 18A having an irregular arrangement. The protruding domains 18A extend into the semiconductor layer 22. The semiconductor layers of the heterostructure, including the semiconductor layer 22, can have a reduced number of threading dislocations due to the presence of the growth layer 18. Additionally, an increased percentage of light can pass through the boundary between the semiconductor layer 22 and the growth layer 18 due to the configuration of the growth layer 18 as described herein. Such an increase can result in, for example, improved light extraction of an optoelectronic device fabricated from the semiconductor heterostructure.

Figure 8A:
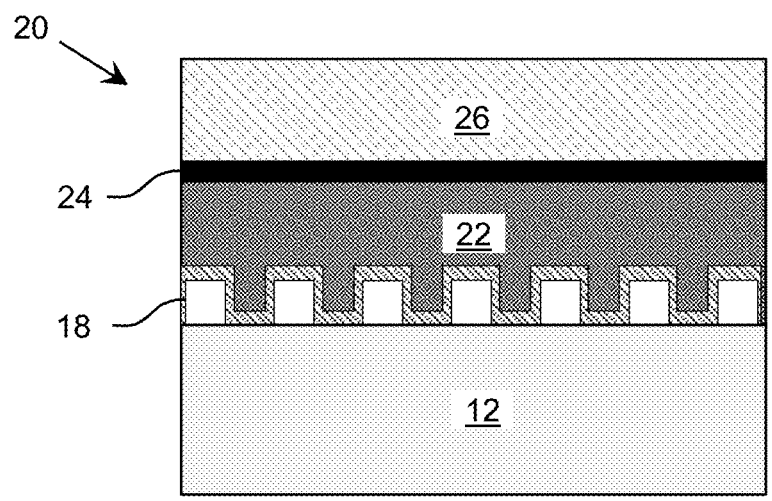
FIGS. 8A and 8B show an illustrative lift off process according to an embodiment.
Figure 8B:
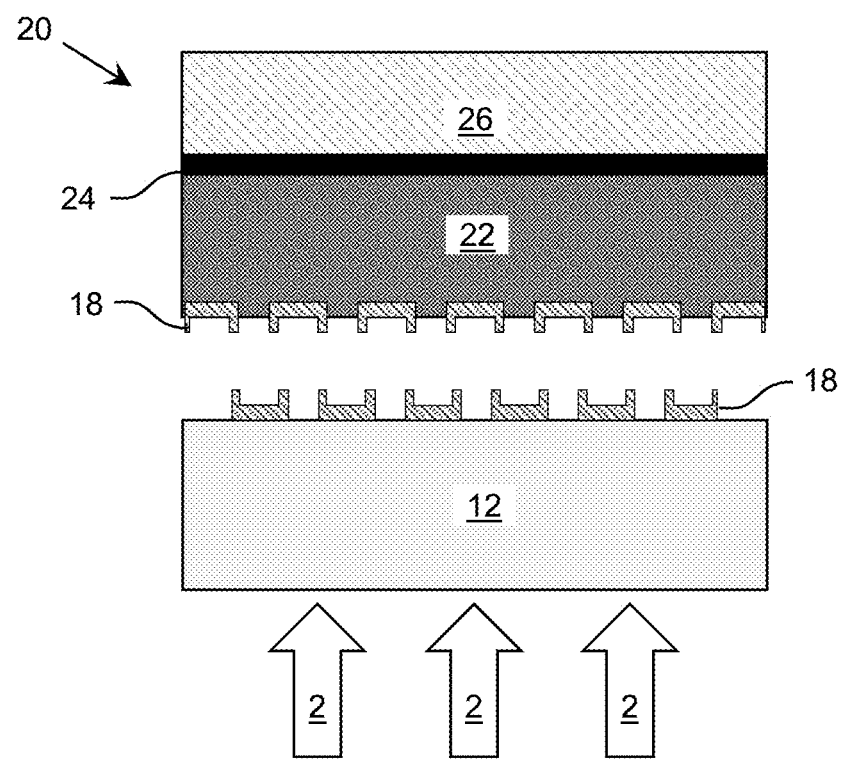

In an embodiment, a growth layer described herein is used as a sacrificial layer as part of a lift off process. For example, FIGS. 8A and 8B show an illustrative lift off process according to an embodiment. As illustrated in FIG. 8A, a semiconductor heterostructure 20 can be fabricated on a substrate 12 on which a growth layer 18 has been formed. The semiconductor heterostructure 20 can include, for example, a first semiconductor layer 22, an active region 24, and a second semiconductor layer 26. The first semiconductor layer 22 can be doped one of n-type or p-type, while the second semiconductor layer 26 can be doped the other of p-type or n-type. The active region 24 can be configured to operate in conjunction with radiation having an operating wavelength. For example, the active region 24 can include a set of quantum wells that are configured to sense and/or emit radiation having the operating wavelength during operation of a corresponding optoelectronic device fabricated from the semiconductor heterostructure 20. While the semiconductor heterostructure 20 is shown including three semiconductor layers 22, 24, 26, it is understood that a semiconductor structure 20 can include any number of semiconductor layers.

To improve the amount of radiation entering or leaving the optoelectronic device during operation, the substrate 12 can be removed using a lift off process. For example, as shown in FIG. 8B, the substrate 12 can be removed by degrading the growth layer 18, e.g., during a laser liftoff process. As illustrated, a laser 2 can be directed at the substrate 12 with a laser wavelength selected to be absorbed by the growth layer 18. Such absorption results in the growth layer 18 degrading and cracking, which can eventually result in the substrate 12 becoming disconnected from the semiconductor heterostructure 20. It is understood that directing the laser at the substrate 12 is only illustrative. For example, in another embodiment, the laser 2 can be directed along a lateral direction of the growth layer 18 to degrade the layer. While laser lift off is shown as an illustrative lift off process, it is understood that lift off can utilize any combination of one or more lift off processes, including laser, mechanical, chemical, and/or the like. After lift off, a portion of the growth layer 18 can remain attached to the semiconductor heterostructure 20. The remaining portion of the growth layer 18 can, for example, improve light extraction from the semiconductor heterostructure 20.

Figure 9:
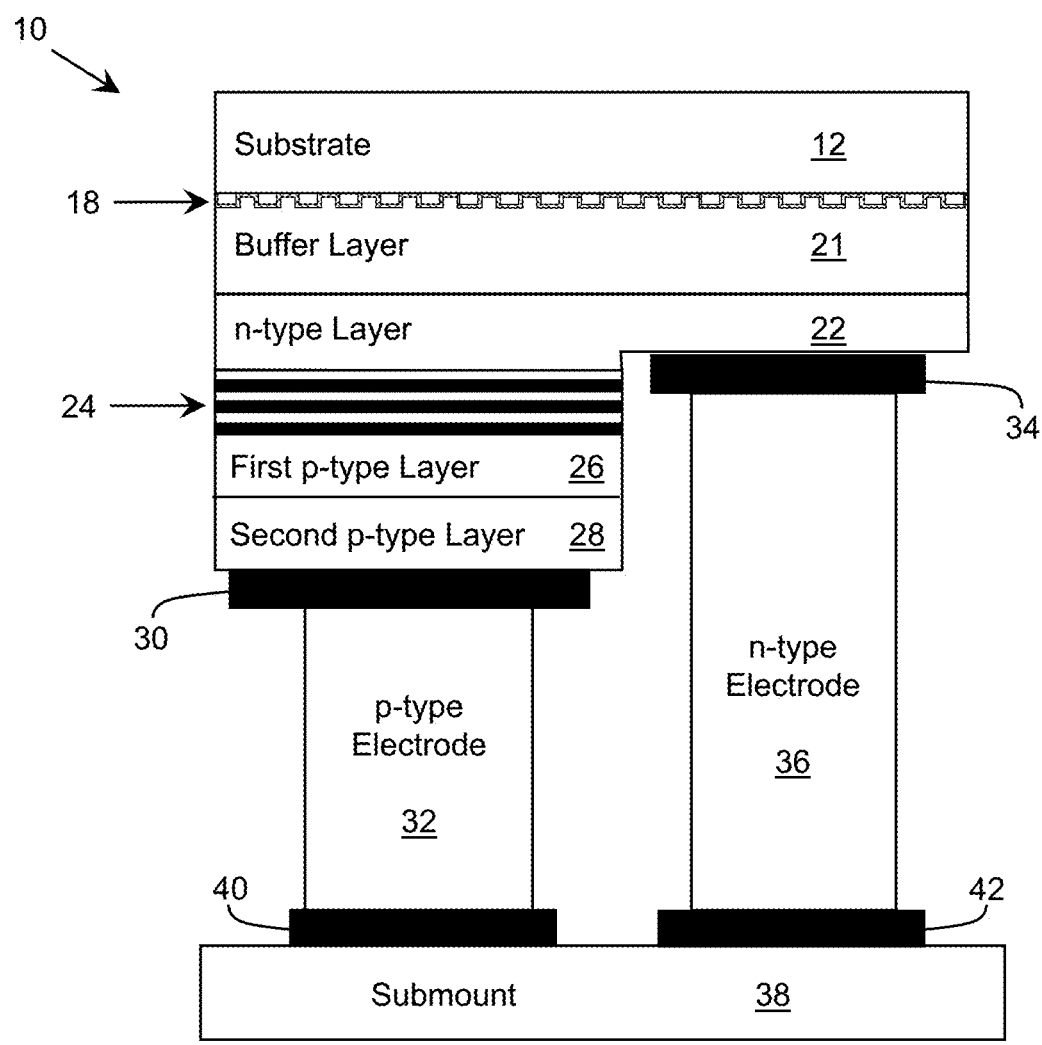
FIG. 9 shows a schematic structure of an illustrative optoelectronic device according to an embodiment.

As discussed herein, the growth layer 18 can be utilized in fabricating an optoelectronic device. To this extent, FIG. 9 shows a schematic structure of an illustrative optoelectronic device 10 according to an embodiment. In a more particular embodiment, the optoelectronic device 10 is configured to operate as an emitting device, such as a light emitting diode (LED) or a laser diode (LD). In either case, during operation of the optoelectronic device 10, application of a bias comparable to the band gap results in the emission of electromagnetic radiation from an active region 24 of the optoelectronic device 10. Alternatively, the optoelectronic device 10 can operate as a sensing device, such as a photodiode.

Regardless, the optoelectronic device 10 can be configured to operate in conjunction with electromagnetic radiation having any operating wavelength. The electromagnetic radiation emitted (or sensed) by the optoelectronic device 10 can have a peak wavelength (e.g., the operating wavelength) within any range of wavelengths, including visible light, ultraviolet radiation, deep ultraviolet radiation, infrared light, and/or the like. In an embodiment, the device 10 is configured to emit (or sense) radiation having an operating wavelength within the ultraviolet range of wavelengths. In a more specific embodiment, the operating wavelength is within a range of wavelengths between approximately 220 and approximately 340 nanometers.

The optoelectronic device 10 includes a heterostructure comprising a substrate 12, a growth layer 18, a buffer layer 21 adjacent to the growth layer 18, an n-type layer 22 (e.g., a cladding layer, electron supply layer, contact layer, and/or the like) adjacent to the buffer layer 21, and an active region 24. Furthermore, the heterostructure of the optoelectronic device 10 includes a first p-type layer 26 (e.g., an electron blocking layer, a cladding layer, hole supply layer, and/or the like) adjacent to the active region 24 and a second p-type layer 28 (e.g., a cladding layer, hole supply layer, contact layer, and/or the like) adjacent to the first p-type layer 26.

In a more particular illustrative embodiment, the optoelectronic device 10 is a group III-V materials based device, in which some or all of the various layers are formed of elements selected from the group III-V materials system. In a still more particular illustrative embodiment, the various layers of the optoelectronic device 10 are formed of group III nitride based materials. Group III nitride materials comprise one or more group III elements (e.g., boron (B), aluminum (Al), gallium (Ga), and indium (In)) and nitrogen (N), such that $B_wAl_xGa_yIn_zN$, where $0 \le w, x, y, z \le 1$, and $w+x+y+z=1$. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

An illustrative embodiment of a group III nitride based optoelectronic device 10 includes an active region 24 (e.g., a series of alternating quantum wells and barriers) composed of $In_yAl_xGa_{1-x-y}N$, $Ga_zIn_yAl_xB_{1-x-y-z}N$, an $Al_xGa_{1-x}N$ semiconductor alloy, or the like. Similarly, the n-type layer 22, the first p-type layer 26, and the second p-type layer 28 can be composed of an $In_yAl_xGa_{1-x-y}N$ alloy, a $Ga_zIn_yAl_xB_{1-x-y-z}N$ alloy, or the like. The molar fractions given by x, y, and z can vary between the various layers 22, 24, 26, and 28. When the optoelectronic device 10 is configured to be operated in a flip chip configuration, such as shown in FIG. 9, the substrate 12 and buffer layer 21 should be transparent to the target electromagnetic radiation. To this extent, an embodiment of the substrate 12 is formed of sapphire, and the buffer layer 21 can be composed of AlN, an AlGaN/AlN superlattice, and/or the like. However, it is understood that the substrate 12 can be formed of any suitable material including, for example, silicon carbide (SiC), silicon (Si), bulk GaN, bulk AlN, bulk ora film of AlGaN, bulk or a film of BN, AlON, $LiGaO_2$, $LiAlO_2$, aluminum oxinitride ($AlO_xN_y$), $MgAl_2O_4$, GaAs, Ge, or another suitable material. Furthermore, a surface of the substrate 12 can be substantially flat or patterned using any solution. For example, the surface of the substrate 12 located opposite the growth layer 18 can include roughness configured to increase an amount of light passing there through. Alternatively, the substrate 12 can be removed during the fabrication of the device 10 as discussed herein.

The optoelectronic device 10 can further include a p-type contact 30, which can form an ohmic contact to the second p-type layer 28, and a p-type electrode 32 can be attached to the p-type contact 30. Similarly, the optoelectronic device 10 can include an n-type contact 34, which can form an ohmic contact to the n-type layer 22, and an n-type electrode 36 can be attached to the n-type contact 34. Each contact 30, 34 can be fabricated from one or more metal layers.

As further shown with respect to the optoelectronic device 10, the device 10 can be mounted to a submount 38 via the electrodes 32, 36 in a flip chip configuration. In this case, the substrate 12 is located on the top of the optoelectronic device 10. To this extent, the p-type electrode 32 and the n-type electrode 36 can both be attached to a submount 38 via contact pads 40, 42, respectively. The submount 38 can be formed of aluminum nitride (AlN), silicon carbide (SiC), and/or the like.

While the growth layer 18 has been shown and described as being located directly on a substrate 12, it is understood that a growth layer described herein can be located anywhere within a heterostructure. For example, a growth layer described herein can be fabricated directly on the buffer layer 21 of the heterostructure.

Figure 10:
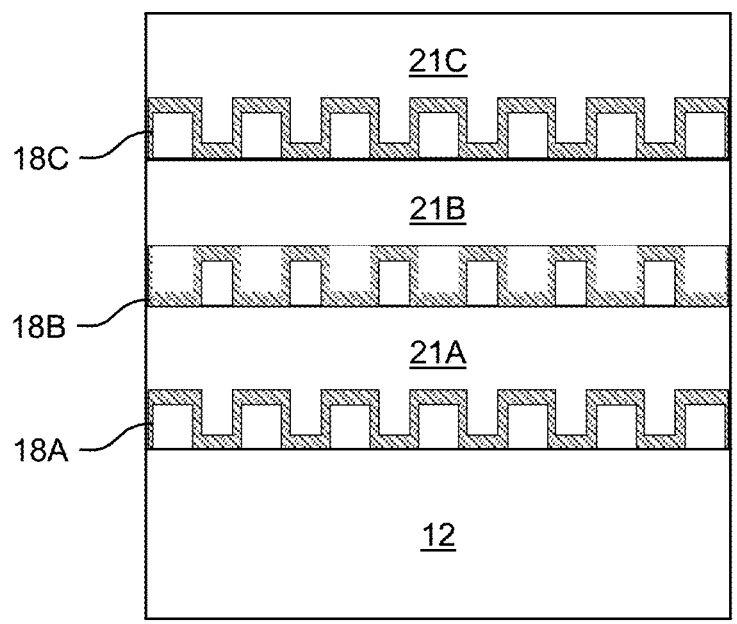
FIG. 10 shows an illustrative heterostructure with a plurality of growth layers according to an embodiment.

In an embodiment, a heterostructure described herein and/or the corresponding optoelectronic device includes a plurality of growth layers. To this extent, FIG. 10 shows an illustrative heterostructure with a plurality of growth layers 18A-18C according to an embodiment. In this case, each growth layer 18A-18C can be separated from another growth layer 18A-18C by one or more semiconductor layers, such as the semiconductor layers 21A-21B. Each semiconductor layer 21A-21B can be fabricated from the same or different semiconductor material. For example, in an embodiment, the growth layers 18A-18C and semiconductor layers 21A-21C can form a buffer structure on which additional semiconductor layers for a device heterostructure are fabricated.

In an embodiment, the growth layers 18A-18C form a vertical periodic structure. In a more particular embodiment, the vertical periodic structure can comprise a photonic crystal. As illustrated, the various protruding domains of the growth layers 18A-18C can be arranged such that the protruding domains of adjacent growth layers are offset from one another. However, it is understood that this is only illustrative, and the protruding domains can have any suitable alignment. In an embodiment, the geometry of the protruding domains of the growth layers 18A-18C is selected to optimize light absorption or light extraction from a corresponding optoelectronic device.

While illustrative aspects of the invention have been shown and described herein primarily in conjunction with a heterostructure for an optoelectronic device and a method of fabricating such a heterostructure and/or device, it is understood that aspects of the invention further provide various alternative embodiments.

Figure 11:
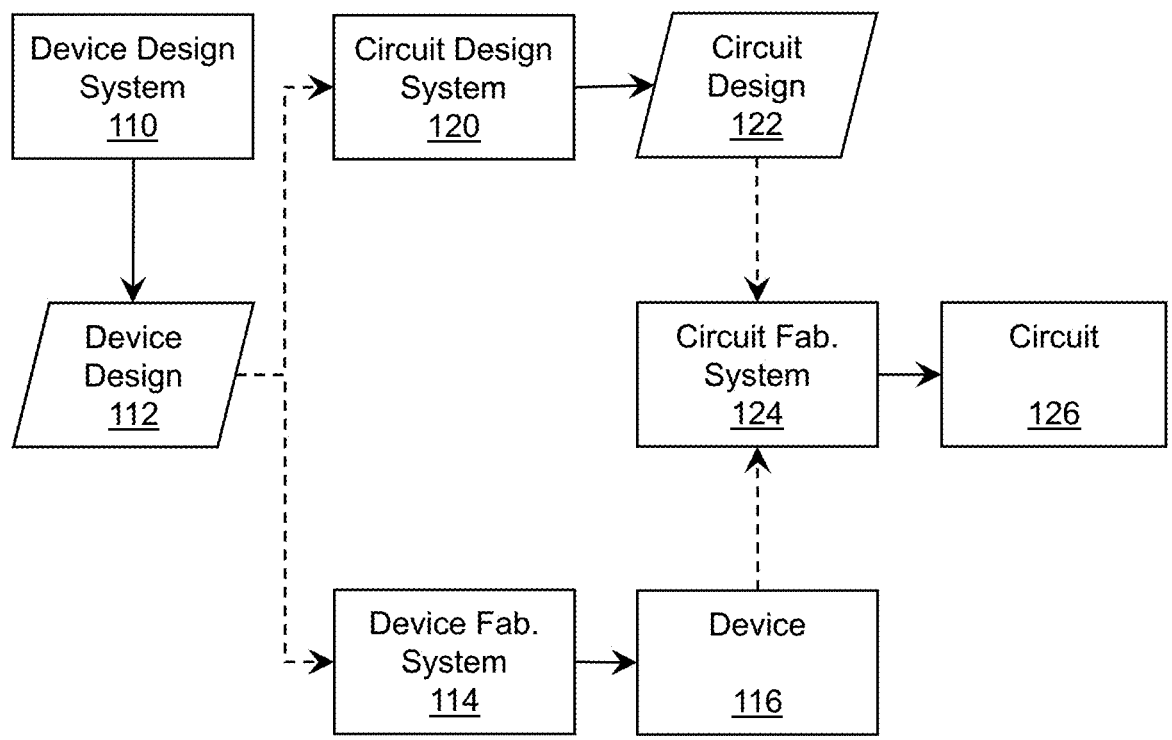
FIG. 11 shows an illustrative flow diagram for fabricating a circuit according to an embodiment.

In one embodiment, the invention provides a method of designing and/or fabricating a circuit that includes one or more of the devices designed and fabricated as described herein. To this extent, FIG. 11 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

As used herein, unless otherwise noted, the term "set" means one or more (i.e., at least one) and the phrase "any solution" means any now known or later developed solution. The singular forms "a," "an," and "the" include the plural forms as well, unless the context clearly indicates otherwise. Additionally, the terms "comprises," "includes," "has," and related forms of each, when used in this specification, specify the presence of stated features, but do not preclude the presence or addition of one or more other features and/or groups thereof.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A heterostructure for an optoelectronic device, the heterostructure comprising:
   an active region configured to operate in conjunction with radiation having an operating wavelength;
   a substrate having a growth surface; and
   a growth layer located between the active region and the growth surface of the substrate, wherein the growth layer is formed of a first material and includes a plurality of protruding domains extending away from the growth surface of the substrate toward the active region, wherein the first material comprises aluminum oxide, and wherein at least some of the plurality of protruding domains include internal regions comprising a second material different from the first material, wherein an index of refraction of the second material for radiation having the operating wavelength is lower than an index of refraction of the first material for radiation having the operating wavelength.

2. The heterostructure of claim 1, wherein the radiation is ultraviolet radiation.

3. The heterostructure of claim 2, wherein the operating wavelength is within a range of 220 nanometers to 340 nanometers.

4. The heterostructure of claim 1, wherein the second material is transparent to the radiation.

5. The heterostructure of claim 4, wherein the second material is a gas.

6. The heterostructure of claim 1, wherein the first material comprises a composite material including a base material with domains of another material.

7. The heterostructure of claim 6, wherein the base material comprises aluminum oxide and the domains of another material comprise at least one of: platinum or silicon dioxide.

8. The heterostructure of claim 1, wherein the plurality of protruding domains have at least one of: an average horizontal characteristic size or an average vertical characteristic size, on the order of a range of the operating wavelength to ten times the operating wavelength.

9. The heterostructure of claim 1, wherein the plurality of protruding domains have an average separation distance on the order of a range of the operating wavelength to ten times the operating wavelength.

10. The heterostructure of claim 1, wherein the second material is at least one of: silicon dioxide, calcium fluoride, magnesium fluoride, sapphire, aluminum nitride, or AlZnO.

11. The heterostructure of claim 1, wherein the plurality of protrusions form a photonic crystal.

12. The heterostructure of claim 1, further comprising:
a first semiconductor layer located between the active region and the growth layer; and
a second growth layer located between the first semiconductor layer and the active region, wherein the second growth layer includes a second plurality of protruding domains extending away from the first semiconductor layer toward the active region.

13. The heterostructure of claim 1, wherein the growth layer further includes domains of a third material formed therein, wherein the third material of the domains is different from the first material, and wherein at least some of the domains of the third material are formed on portions of the protrusions and at least some of the domains of the third material are formed on sections of the growth layer without protrusions.

14. An optoelectronic device comprising:
an active region configured to operate in conjunction with radiation having an operating wavelength;
a first semiconductor layer located on a first side of the active region; and
a growth layer, wherein the first semiconductor layer is located between the growth layer and the active region, wherein the growth layer is formed of a first material and includes a plurality of protruding domains extending toward the active region, and wherein at least some of the plurality of protruding domains include internal regions comprising a second material different from the first material, wherein the first material comprises aluminum oxide and the second material comprises at least one of: a gas, silicon dioxide, calcium fluoride, magnesium fluoride, sapphire, aluminum nitride, or AlZnO, wherein an index of refraction of the second material for radiation having the operating wavelength is lower than an index of refraction of the first material for radiation having the operating wavelength.

15. The optoelectronic device of claim 14, further comprising a substrate, wherein the growth layer is located directly on the substrate.

16. The optoelectronic device of claim 14, wherein the first material comprises a composite material including aluminum oxide with domains of another material selected from a group consisting of: a metal or silicon dioxide.

17. The optoelectronic device of claim 14, wherein the internal regions of at least some of the plurality of protruding domains comprise a multiple of layers of the second material.

18. A method of fabricating a heterostructure for an optoelectronic device, the method comprising:
depositing a continuous pattern layer adjacent to a growth surface of a substrate;
altering the continuous pattern layer to a non-continuous pattern layer;
forming a growth layer on the non-continuous pattern layer, wherein the growth layer is formed of a first material and includes a plurality of protruding domains, wherein at least some of the plurality of protruding domains include internal regions comprising a second material different from the first material; and
forming an active region configured to operate in conjunction with radiation having an operating wavelength, wherein the plurality of protruding domains of the growth layer extend away from the growth surface of the substrate toward the active region, wherein an index of refraction of the second material for radiation having the operating wavelength is lower than an index of refraction of the first material for radiation having the operating wavelength.

19. The method of claim 18, wherein the altering of the continuous pattern layer to the non-continuous pattern layer includes:
forming an imprint pattern on the continuous pattern layer, wherein the imprint pattern includes higher and lower domains of the pattern layer; and
etching the continuous pattern layer to create the non-continuous pattern layer, the non-continuous pattern layer having a plurality of spaced protruding regions defined by exposed regions of the substrate; and
wherein the forming of the growth layer includes:
constructing the growth layer on the plurality of protruding regions and exposed regions of the substrate.

20. The method of claim 19, wherein the constructing the growth layer includes:
depositing a material for the growth layer on the plurality of protruding regions and exposed regions of the substrate; and
annealing the material, wherein the annealing degrades at least a portion of the pattern layer.

* * * * *